(12) United States Patent
Kim et al.

(10) Patent No.: US 9,601,994 B2
(45) Date of Patent: Mar. 21, 2017

(54) INTERNAL VOLTAGE GENERATION CIRCUIT

(71) Applicant: SK hynix Inc., Gyeonggi-do (KR)

(72) Inventors: Chi-Hyun Kim, Gyeonggi-do (KR); Jae-Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/823,687

(22) Filed: Aug. 11, 2015

(65) Prior Publication Data

US 2016/0233765 A1 Aug. 11, 2016

(30) Foreign Application Priority Data

Feb. 6, 2015 (KR) .......................... 10-2015-0018373

(51) Int. Cl.
| | |
|---|---|
| *G05F 1/10* | (2006.01) |
| *G05F 3/02* | (2006.01) |
| *H02M 3/07* | (2006.01) |
| *G11C 11/4074* | (2006.01) |
| *G11C 5/14* | (2006.01) |

(52) U.S. Cl.
CPC ............... *H02M 3/07* (2013.01); *G11C 5/145* (2013.01); *G11C 5/147* (2013.01); *G11C 11/4074* (2013.01)

(58) Field of Classification Search
CPC .. H02M 3/073; H02M 3/07; H02M 2003/077; G11C 5/145; G05F 3/205

USPC ......................................................... 327/536
See application file for complete search history.

(56) References Cited

U.S. PATENT DOCUMENTS

| | | | | |
|---|---|---|---|---|
| 5,066,870 | A * | 11/1991 | Kobatake ...................... | 327/536 |
| 5,301,146 | A * | 4/1994 | Hama ........................... | 365/154 |
| 5,999,040 | A * | 12/1999 | Do et al. ....................... | 327/536 |
| 6,151,229 | A * | 11/2000 | Taub et al. ...................... | 363/60 |
| 6,373,327 | B1 * | 4/2002 | Nakamura .................... | 327/536 |
| 6,411,531 | B1 * | 6/2002 | Nork et al. ..................... | 363/60 |
| 6,774,707 | B1 * | 8/2004 | Smith et al. .................. | 327/536 |
| 7,271,642 | B2 * | 9/2007 | Chen et al. .................... | 327/514 |
| 7,724,551 | B2 * | 5/2010 | Yanagida et al. ............... | 363/60 |
| 8,648,646 | B2 * | 2/2014 | Mohan et al. ................ | 327/536 |
| 2002/0130701 | A1 * | 9/2002 | Kleveland ..................... | 327/536 |
| 2012/0169407 | A1 * | 7/2012 | Noh .............................. | 327/536 |
| 2014/0022005 | A1 * | 1/2014 | Ramanan et al. ............ | 327/536 |

FOREIGN PATENT DOCUMENTS

| | | | | | |
|---|---|---|---|---|---|
| EP | | 164868 A | * 12/1985 | ............... | 365/189.09 |
| KR | 1019970003253 | | 1/1997 | | |

* cited by examiner

*Primary Examiner* — Quan Tra
(74) *Attorney, Agent, or Firm* — IP & T Group LLP (57) ABSTRACT

Disclosed herein is an internal voltage generation circuit for generating a pumping voltage. The internal voltage generation circuit may include a pumping unit suitable for generating a pumping voltage by pumping an input voltage and a control unit suitable for stepwise controlling a voltage level of the input voltage based on the breakdown voltage information of the pumping unit.

17 Claims, 8 Drawing Sheets

| V_IN | V_OUT |
|------|-------|
| 2    | 4     |
| 4    | 6     |
| 6    | 8     |
| 8    | 10    |
| 10   | 12    |

INTERNAL VOLTAGE GENERATION CIRCUIT

CROSS-REFERENCE TO RELATED APPLICATIONS

The present application claims priority of Korean Patent Application No. 10-2015-0018373, filed on Feb. 6, 2015, which is incorporated herein by reference in its entirety.

BACKGROUND

1. Field

Exemplary embodiments of the present invention relate to a semiconductor design technology and, more particularly, to an internal voltage generation circuit for generating a pumping voltage.

2. Description of the Related Art

In general, semiconductor devices such as double data rate synchronous DRAM (DDR SDRAM) generate internal voltages having various voltage levels, which are supplied to internal circuits. Semiconductor devices accomplish this by using power from external controllers. The internal voltages include those that are generated through down conversion operations and pumping operations. Internal voltages generated through down conversion operations include, for example, core voltages used to set data levels in the semiconductor memory devices and precharge voltages used to precharge bit lines. The internal voltages generated through pumping operations include pumping voltages applied to gates of cell transistors and substrate bias voltages applied to substrates of cell transistors.

As the integration of semiconductor devices is increased, a design rule of a sub-micron grade or less is applied to the design of internal circuits. In order to drive such a fine circuit at high speed, the voltage level of power applied to the circuit is lowered. Accordingly, the voltage supplied to semiconductor devices is also lowered. In recent years, much effort has been given to generate internal voltages using low supply voltages.

Pumping voltage generation circuits of internal voltage generation circuits are described below as an example.

Figure 1:
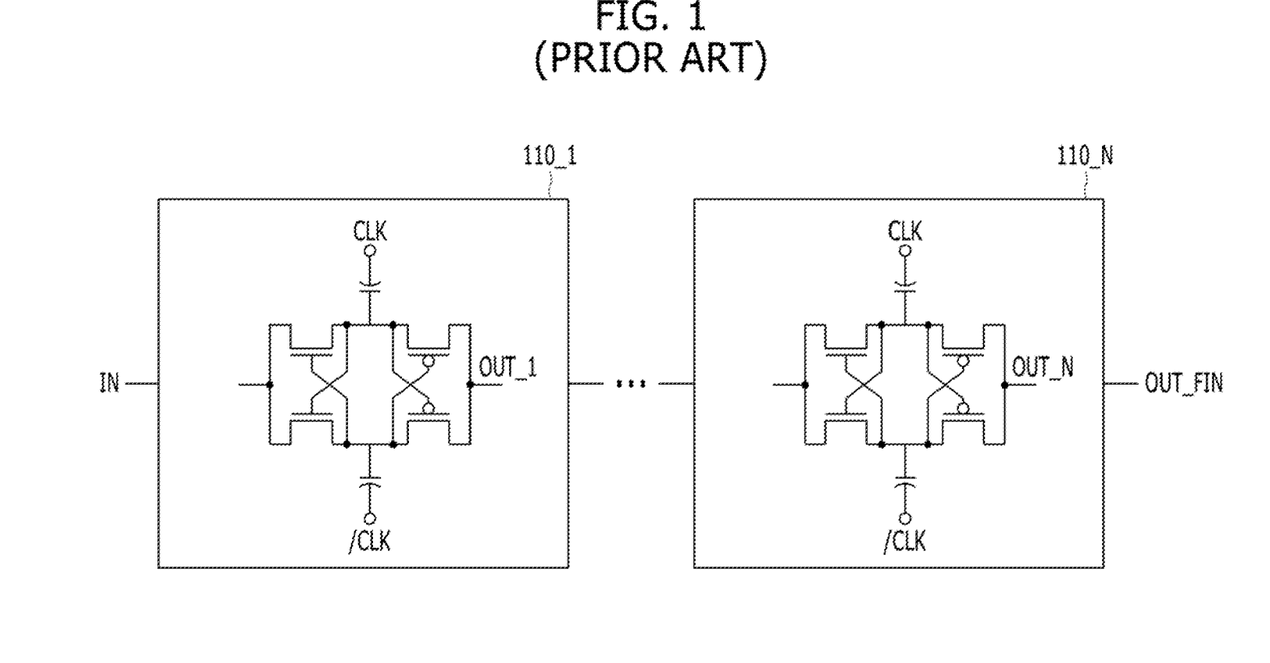
FIG. 1 is a diagram illustrating a conventional pumping voltage generation circuit.

FIG. 1 is a diagram illustrating a conventional pumping voltage generation circuit.

Referring to FIG. 1, the pumping voltage generation circuit has first to N-th pumping units 110_1 to 110_N for generating pumping voltages by pumping an input voltage.

The first pumping unit 110_1 pumps the input voltage received through an input terminal IN. The first pumping unit 110_1 pumps the input voltage in response to positive/negative clock signals CLK and /CLK and outputs the pumping voltage to a first output terminal OUT_1. Although not illustrated in FIG. 1 for simplicity, the first pumping unit 110_1 is coupled to the second pumping unit. The second pumping unit receives the pumping voltage from the first pumping unit 110_1, pumps the received voltage, and outputs the pumping voltage to a second output terminal (not illustrated). Next, the N-th pumping unit 110_N receives a voltage output from a pumping unit at a previous stage, pumps the received voltage, and outputs the pumping voltage to a final output terminal OUT_FIN.

A brief circuit operation of the pumping voltage generation circuit is described below with reference to FIG. 1. It is assumed that the number of pumping units is 9, i.e., N=9, for convenience. That is, the pumping voltage generation circuit may include first to ninth pumping units. Furthermore, it is assumed that the input voltage of 2 V is applied to the input terminal IN and each of the first to ninth pumping units performs a pumping operation with 2 V.

First, the first pumping unit 110_1 receives the input voltage of 2 V and performs a pumping operation when the positive/negative clock signals CLK and /CLK are toggled. The voltage level of the first output terminal OUT_1 is gradually raised up to 4 V through the pumping operation. The second pumping unit receives a voltage output through the first output terminal OUT_1 of the first pumping unit 110_1 and performs a pumping operation when the positive/negative clock signals CLK/CLK are toggled. Likewise, the ninth pumping unit performs a pumping operation. As a result, the voltage level of the final output terminal OUT_FIN may be pumped up to 20 V.

In order to obtain the pumping voltage of 20 V using the input voltage of 2 V, nine pumping units are required. For example, a scenario in which the input voltage is set to 12 V and a pumping voltage of 20 V is generated will be discussed. In this case, only four pumping units are required to generate the pumping voltage of 20 V. However, a breakdown voltage of the first pumping unit 110_1 needs to be 12 V or more. For example, if the first pumping unit 110_1 has a breakdown voltage of about 2 V, operation of the pumping voltage generation circuit is impossible. When the breakdown voltage of the first pumping unit 110_1 is set high, however, the size of the first pumping unit 110_1 needs to be large. This means that the size of the pumping voltage generation circuit is increased, which undesirable as the trend is to continue decreasing the amount of chip area consumed.

SUMMARY

Various embodiments are directed to an internal voltage generation circuit which controls a pumping operation by taking a breakdown voltage of a unit pumping circuit into consideration.

In accordance with an embodiment of the present invention, an internal voltage generation circuit may include: a pumping unit suitable for generating a pumping voltage by pumping an input voltage; and a control unit suitable for stepwise controlling a voltage level of the input voltage based on breakdown voltage information of the pumping unit.

The control unit may include: a voltage generation unit suitable for generating a plurality of reference voltages; a control signal generation unit suitable for generating a plurality of control signals based on the breakdown voltage information; and a selection output unit suitable for selectively outputting the plurality of reference voltages in response to the plurality of control signals.

An initial voltage level of the input voltage may be set based on the breakdown voltage information.

The control unit may include a depletion type transistor coupled between a supply voltage terminal and an input terminal of the pumping unit and having a gate receiving a voltage corresponding to the breakdown voltage information of the pumping unit.

The pumping unit comprises a plurality of pumping units.

The internal voltage generation circuit may further include: a multiplexing unit suitable for selecting an output voltage of one of the pumping units and feeding the selected output voltage back to the gate of the depletion type transistor.

The internal voltage generation circuit may further include: a voltage detection unit suitable for detecting a voltage level of a supply voltage supplied to the control unit;

and a selection output unit suitable for outputting an output voltage of one of the pumping units as the pumping voltage in response to an output signal of the voltage detection unit.

An output voltage of one of the pumping units may be fed back to the gate of the depletion type transistor.

In accordance with another embodiment of the present invention, an internal voltage generation circuit may include: a pumping unit suitable for generating a pumping voltage by pumping an input voltage; a detection unit suitable for detecting an output voltage of the pumping unit based on breakdown voltage information of the pumping unit; and a control unit suitable for stepwise controlling a voltage level of the input voltage based on the breakdown voltage information and an output signal of the detection unit.

The detection unit may control when the input voltage is changed.

The pumping unit may include a plurality of pumping units, and the internal voltage generation circuit may further include a multiplexing unit suitable for selecting an output voltage of the pumping units and feeding the selected output voltage back to the detection unit.

The pumping unit may include a plurality of pumping units, and the internal voltage generation circuit may further include: a voltage detection unit suitable for detecting a voltage level of a supply voltage supplied to the control unit; and a selection output unit suitable for outputting an output voltage of one of the pumping units as the pumping voltage in response to an output signal of the voltage detection unit.

An initial voltage level of the input voltage may be set based on the breakdown voltage information.

In accordance with yet another embodiment of the present invention, an internal voltage generation circuit may include: a pumping unit suitable for generating a pumping voltage by pumping an input voltage; and a depletion type transistor coupled between a supply voltage terminal and an input terminal of the pumping unit and having a gate to which an output voltage of the pumping unit is fed back.

A threshold voltage value of the depletion type transistor may be set based on a breakdown voltage value of the pumping unit.

The threshold voltage value of the depletion type transistor may be set to a value that is less than the breakdown voltage value of the pumping unit.

The depletion type transistor may generate the input voltage by stepwise controlling a supply voltage supplied to the supply voltage terminal in response to the output voltage of the pumping unit.

The pumping unit may include a plurality of pumping units, and the internal voltage generation circuit may further include a multiplexing unit suitable for selecting an output voltage of one of the pumping units and feeding the selected output voltage to the gate of the depletion type transistor.

The pumping unit may include a plurality of pumping units, and the internal voltage generation circuit may further include: a voltage detection unit suitable for detecting a voltage level of a supply voltage supplied to the supply voltage terminal; and a selection output unit suitable for outputting an output voltage of one of the pumping units as the pumping voltage in response to an output signal of the voltage detection unit.

An output voltage of one of the pumping units may be fed back to the gate of the depletion type transistor.

The pumping voltage generation circuit in accordance with an embodiment of the present invention may control an input voltage by taking a breakdown voltage of a unit pumping circuit into consideration and minimize an area of the internal voltage generation circuit through such an operation.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In an embodiment of the present invention, a pumping voltage generation circuit of an internal voltage generation circuit is described as an example.

Figure 2:
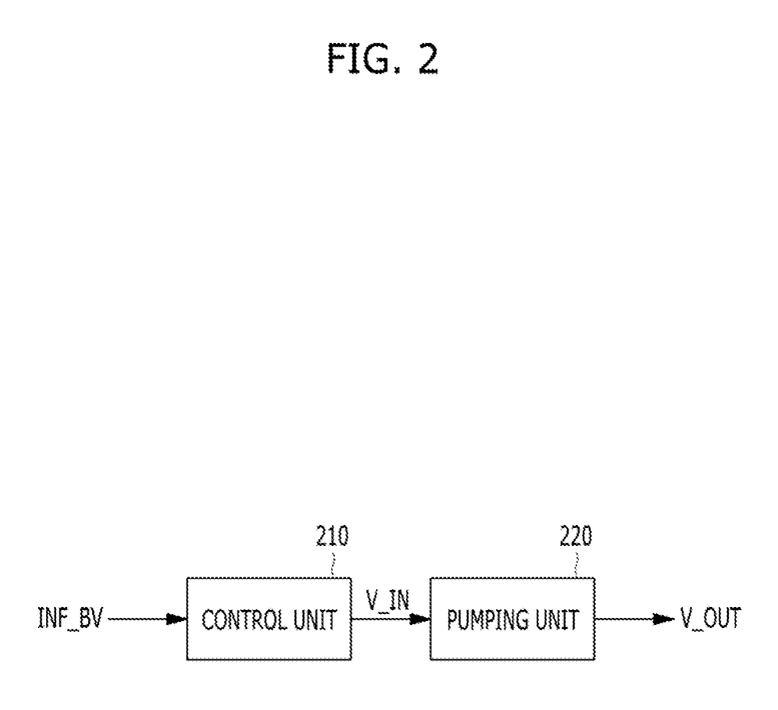
FIG. 2 is a block diagram illustrating a pumping voltage generation circuit in accordance with an embodiment of the present invention.

FIG. 2 is a block diagram illustrating a pumping voltage generation circuit in accordance with an embodiment of the present invention.

Referring to FIG. 2, the pumping voltage generation circuit may include a control unit 210 and a pumping unit 220.

The control unit 210 stepwise controls a voltage level of an input voltage V_IN based on breakdown voltage information INF_BV. The breakdown voltage information INF_BV is the breakdown voltage value of the pumping unit 220. To stepwise control the input voltage V_IN includes controlling both an initial voltage level of the input voltage V_IN and a voltage change rate of the input voltage V_IN.

The pumping unit 220 generates a final pumping voltage V_OUT by pumping the input voltage V_IN. The pumping unit 220 may include at least one pumping unit. The breakdown voltage information INF_BV includes the breakdown voltage value of the pumping unit included in the pumping unit 220 and may be the breakdown voltage value of the pumping unit to which the input voltage V_IN is applied.

The pumping voltage generation circuit in accordance with the embodiment of the present invention may stepwise control the voltage level of the input voltage V_IN based on the breakdown voltage information INF_BV and may reduce the number of pumping units included in the pumping unit 220 through such an operation.

An example in which the pumping unit 220 includes four pumping units is described, for convenience. As will be described later, the number of pumping units included in the pumping unit 220 may be smaller than the number of pumping units of FIG. 1. For reference, in FIG. 1, assuming that the input voltage is 2 V and the final output voltage is 20 V, nine pumping units have been illustrated as being included in the pumping unit.

Figure 3:
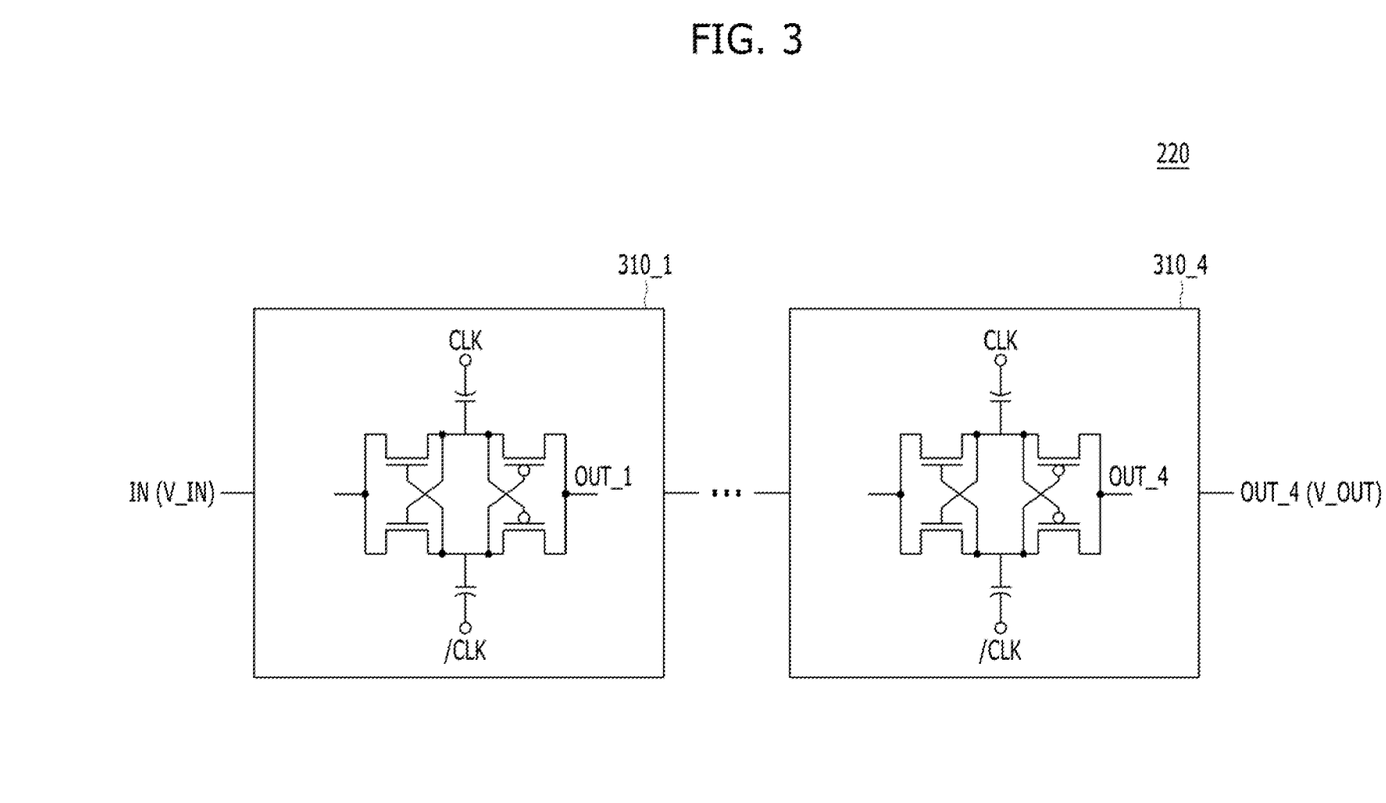
FIG. 3 is a block diagram illustrating a pumping unit of FIG. 2.

FIG. 3 is a block diagram illustrating the pumping unit 220 of FIG. 2.

Referring to FIG. 3, the pumping unit 220 includes first to fourth pumping units 310_1, 310_2, 310_3, and 310_4 for generating pumping voltages through pumping operations.

The first pumping unit 310_1 pumps the input voltage V_IN received through an input terminal IN. The first pumping unit 310_1 pumps the input voltage V_IN in response to positive/negative clock signals CLK and /CLK and outputs the pumping voltage to a first output terminal OUT_1. Although not illustrated in FIG. 3, the first pumping unit 310_1 is coupled to the second pumping unit. The second pumping unit receives the pumping voltage from the first pumping unit 310_1, pumps the received pumping voltage, and outputs the pumping voltage to a second output terminal (not illustrated). Likewise, the third pumping unit performs the pumping operation to output the pumping voltage to a third output terminal (not illustrated), and may have a similar configuration as the first pumping unit 310_1.

The fourth pumping unit 310_4 receives the pumping voltage from the third output terminal of the third pumping unit, generates a final pumping voltage V_OUT by pumping the received pumping voltage, and outputs the generated final pumping voltage V_OUT to a fourth output terminal OUT_4.

A brief circuit operation of the pumping voltage generation circuit is described below with reference to FIGS. 2 and 3. It is assumed that a breakdown voltage of the first pumping unit 310_1 of the first to fourth pumping units 3101, 310_2, 310_3, and 310_4 is 2 V and each of the first to fourth pumping units 310_1, 310_2, 310_3, and 310_4 performs a pumping operation of 2 V.

The control unit 210 of FIG. 2 may stepwise control the voltage level of the input voltage V_IN based on the breakdown voltage information INF_BV. In other words, since the breakdown voltage of the first pumping unit 310_1 is 2 V, the initial voltage level of the input voltage V_IN has been set to 2 V, and the voltage change rate of the input voltage V_IN is set such that a voltage is set to be changed by 2 V from the initial voltage level. That is, the input voltage V_IN may be controlled so that it changes from 2 V->4 V-> . . . , ->12 V.

First, the first pumping unit 310_1 receives the input voltage V_IN of 2 V and performs the pumping operation when the positive/negative clock signals CLK and /CLK are toggled. The voltage level of the first output terminal OUT_1 gradually rises to 4 V through the pumping operation. Next, the second to fourth pumping units 310_2, 310_3, and 310_4 generate the final pumping voltage V_OUT by performing the pumping operations. The control unit 210 controls the voltage level of the input voltage V_IN to 4 V. The first pumping unit 310_1 pumps the voltage level of the first output terminal OUT_1 up to 6 V by pumping the input voltage V_IN of 4 V. Likewise, the second to fourth pumping units 310_2, 310_3, and 310_4 also generate the final pumping voltage V_OUT by performing the pumping operations. As a result, the final pumping voltage V_OUT may be pumped up to 20 V through the pumping operations.

As described above, the control unit 210 may stepwise control the input voltage V_IN based on the breakdown voltage information INF_BV. Accordingly, a voltage level difference between the input terminal IN and the first output terminal OUT_1 of the first pumping unit 310_1 does not exceed 2 V.

The pumping voltage generation circuit in accordance with the embodiment of the present invention may overcome limitations attributable to the breakdown voltage of a pumping unit by controlling the voltage level of the input voltage V_IN based on the breakdown voltage information INF_BV.

Figure 4:
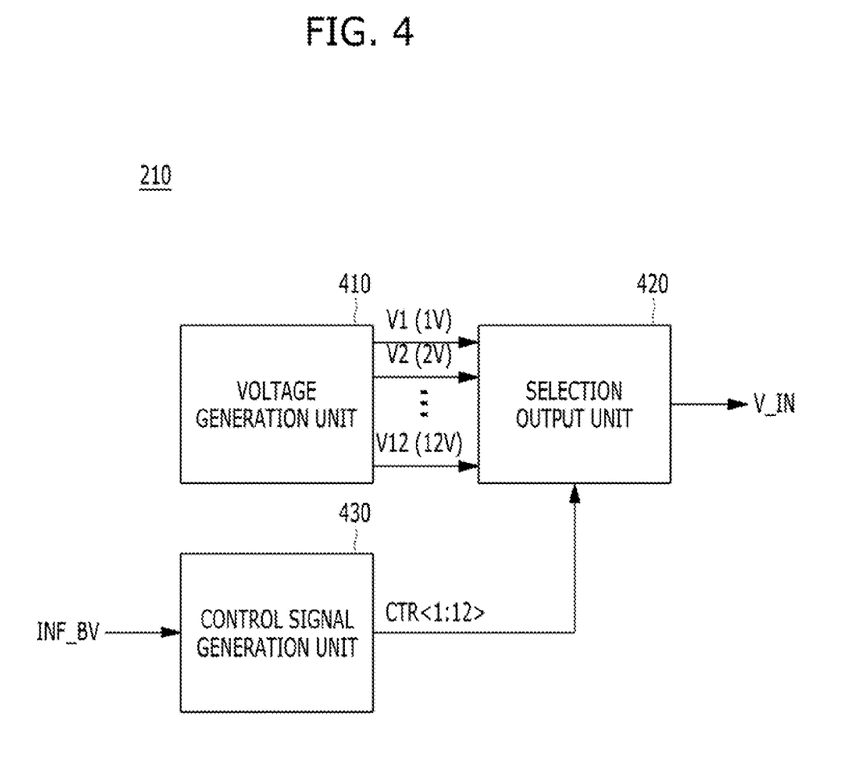
FIG. 4 is a block diagram illustrating a control unit of FIG. 2.

FIG. 4 is a block diagram illustrating the control unit 210 of FIG. 2.

Referring to FIG. 4, the control unit 210 may include a voltage generation unit 410, a selection output unit 420, and a control signal generation unit 430.

The voltage generation unit 410 generates first to twelfth reference voltages V1 to V12 having a plurality of voltage levels. In this case, it is assumed that the highest voltage level of the first to twelfth reference voltages V1 to V12 is set to 12 V and the first to twelfth reference voltages V1 to V12 have a difference of 1 V, from 1 V to 12 V.

The selection output unit 420 outputs any one of the first to twelfth reference voltages V1 to V12 as the input voltage V_IN in response to control signals CTR<1:12>.

The control signal generation unit 430 generates the control signals CTR<1:12> based on the breakdown voltage information INF_BV. The control signals CTR<1:12> are controlled based on the breakdown voltage information INF_BV. As described above, the voltage change rate of the input voltage V_IN may be controlled from the initial voltage level of the input voltage V_IN based on the breakdown voltage information INF_BV. Furthermore, the control signal generation unit 430 serves to selectively enable the control signals CTR<1:12> so that the input voltage V_IN is controlled to a voltage level corresponding to the breakdown voltage information INF_BV.

As a result, the control unit 210 may control the voltage level of the input voltage V_IN, from 2 V->4 V-> . . . , ->12 V, through a configuration as shown in FIG. 4. Accordingly, the voltage level difference between the input terminal IN and the first output terminal OUT_1 of the first pumping unit 310_1 (refer to FIG. 3) may not exceed 2 V.

The pumping voltage generation circuit in accordance with the embodiment of the present invention may overcome limitations attributable to a breakdown voltage of a pumping unit by controlling the voltage level of the input voltage V_IN based on the breakdown voltage information INF_BV.

When the voltage level of the input voltage V_IN is changed can differ depending on the design. This is described below with reference to the example of FIG. 5.

Figure 5:
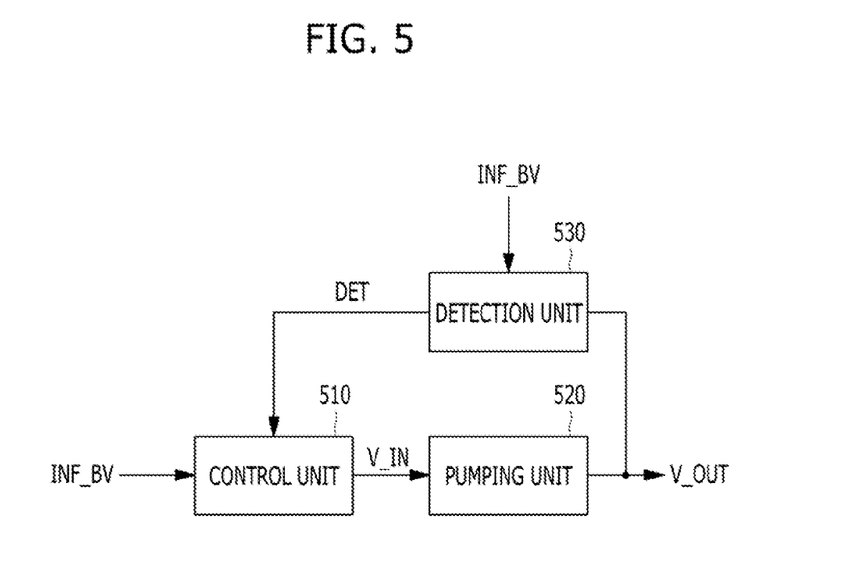
FIG. 5 is a block diagram illustrating a pumping voltage generation circuit in accordance with an embodiment of the present invention.

FIG. 5 is a block diagram illustrating a pumping voltage generation circuit in accordance with an embodiment of the present invention.

Referring to FIG. 5, the pumping voltage generation circuit may include a control unit 510, a pumping unit 520, and a detection unit 530.

The control unit 510 controls a voltage level of an input voltage V_IN based on breakdown voltage information INF_BV. The pumping unit 520 generates a final pumping voltage V_OUT by pumping the input voltage V_IN. Furthermore, the detection unit 530 detects a voltage level of the final pumping voltage V_OUT in response to a voltage level corresponding to the breakdown voltage information INF_BV and outputs the detected voltage level as a detection signal DET. The detection signal DET is provided to the control unit 510. The control unit 510 may control when the input voltage V_IN is controlled in response to the detection signal DET. That is, the control unit 510 generates the input voltage V_IN that is controlled from 2 V->4 V-> . . . , ->12 V. In this case, when the input voltage V_IN is changed, for example 2 V->4 V-> . . . , ->12 V, is determined by the detection signal DET.

Figure 6:
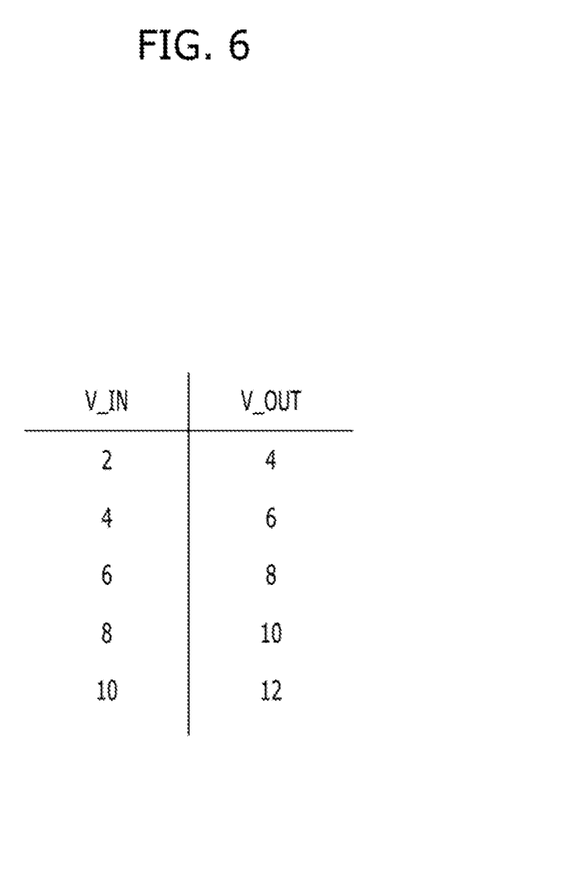
FIG. 6 is a table showing an operation of the pumping voltage generation circuit of FIG. 5.

FIG. 6 is a table illustrating an operation of the pumping voltage generation circuit of FIG. 5. The input voltages V_IN and the final pumping voltages V_OUT are illustrated in FIG. 6.

The operation of the pumping voltage generation circuit is described with reference to FIGS. 5 and 6. It will be assumed that the pumping unit 520 is formed of a single pumping unit, for convenience.

First, the control unit 510 sets the input voltage V_IN to 2 V and provides the set input voltage V_IN to the pumping unit 520. The pumping unit 520 generates the final pumping voltage V_OUT of 4 V by pumping the input voltage V_IN. Next, the detection unit 530 detects that the final pumping voltage V_OUT has increased up to 4 V and generates the detection signal DET. The control unit 510 controls the input voltage V_IN from 2 V to 4 V in response to the detection signal DET. For reference, when it is assumed that a breakdown voltage is 2 V, the input voltage V_IN may be controlled to 6 V, not 4 V.

As may be seen from FIG. 5, a voltage level difference between the input voltage V_IN and the final pumping voltage V_OUT does not exceed 2 V. That is, a voltage level difference between the input terminal and the output terminal of a pumping unit included in the pumping unit 520 does not exceed 2 V. Accordingly, the pumping voltage generation circuit in accordance with the embodiment of the present invention may overcome limitations attributable to breakdown voltage in performing a pumping operation.

Figure 7:
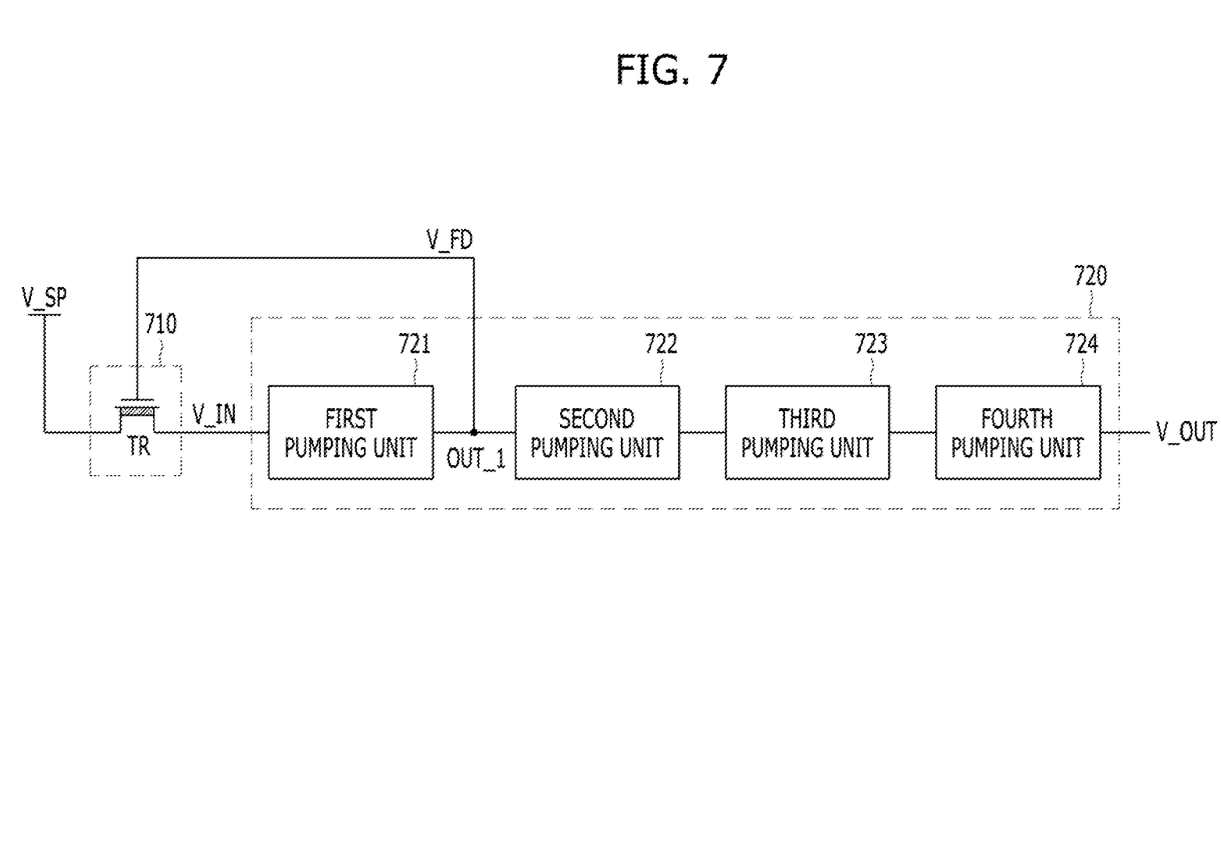
FIG. 7 is a block diagram illustrating a pumping voltage generation circuit in accordance with an embodiment of the present invention.

FIG. 7 is a block diagram illustrating a pumping voltage generation circuit in accordance with an embodiment of the present invention.

Referring to FIG. 7, the pumping voltage generation circuit may include a control unit 710 and a pumping unit 720.

The control unit 710 stepwise controls a supply voltage V_SP in response to an output voltage V_FD fed back from a first output terminal OUT_1 of a first pumping unit 721 and outputs the controlled voltage as an input voltage V_IN. The control unit 710 may include a depletion type transistor TR having a gate supplied with the output voltage V_FD of the first pumping unit 721. The depletion type transistor TR may be designed to have a threshold voltage value corresponding to the breakdown voltage value of the first pumping unit 721. For example, if the breakdown voltage value of the first pumping unit 721 is 2.5 V greater than 2 V, the threshold voltage value of the depletion type transistor TR may be designed to have 2 V. That is, the threshold voltage value of the depletion type transistor TR has to be designed to be smaller than the breakdown voltage value of the first pumping unit 721.

The pumping unit 720 serves to pump the Input voltage V_IN input from the control unit 710 and may include first to fourth pumping units 721, 722, 723, and 724. It is assumed that the pumping unit 720 in accordance with the embodiment of FIG. 7 includes the four pumping units, for convenience.

A brief circuit operation of the pumping voltage generation circuit is described below. It is assumed that the supply voltage V_SP is 12 V and the threshold voltage value of the depletion type transistor TR is 2 V, for convenience of description.

First, the output voltage V_FD at the first output terminal OUT_1 of the first pumping unit 721 is 0 V, and is applied to the gate of the depletion type transistor TR. In response to the output voltage V_FD of 0 V, the depletion type transistor TR outputs the input voltage V_IN of 2 V based on the supply voltage V_SP of 12 V because the threshold voltage value of the depletion type transistor TR is 2 V. Furthermore, the output voltage V_FD at the first output terminal OUT_1 rises up to 4 V because the first pumping unit 721 pumps the input voltage V_IN.

When the output voltage V_FD at the first output terminal OUT_1 becomes 2 V, the output voltage V_FD of 2 V is supplied to the gate of the depletion type transistor TR. In response to the output voltage V_FD of 2 V, the depletion type transistor TR outputs the input voltage V_IN of 4 V based on the supply voltage V_SP of 12 V. Accordingly, the output voltage V_FD at the first output terminal OUT_1 of the first pumping unit 721 rises up to 6 V. As a result, the input voltage V_IN rises up from 2 V->4 V-> . . . , ->12 V, and the first pumping unit 721 generates a pumping voltage of 14 V. The second to fourth pumping units 722, 723, and 724 in subsequent stages also perform pumping operations. Accordingly, the second pumping unit 722 generates a pumping voltage of 16 V, the third pumping unit 723 a pumping voltage of 18 V, and the last fourth pumping unit 724 a pumping voltage of 20 V.

As a result, a voltage level difference between the input terminal and the output terminal of the first pumping unit 721 does not exceed 2 V. Furthermore, a final pumping voltage V_OUT of 20 V may be generated using the first to fourth pumping units 721, 722, 723, and 274, that is, four pumping units.

The pumping voltage generation circuit in accordance with an embodiment of the present invention may overcome limitations attributable to the breakdown voltage of a pumping unit because the depletion type transistor TR of the control unit 710 stepwise controls the input voltage V_IN. Furthermore, the pumping voltage generation circuit in accordance with an embodiment of the present invention may minimize the number of pumping units used to generate a pumping voltage having a higher voltage level.

Figure 8:
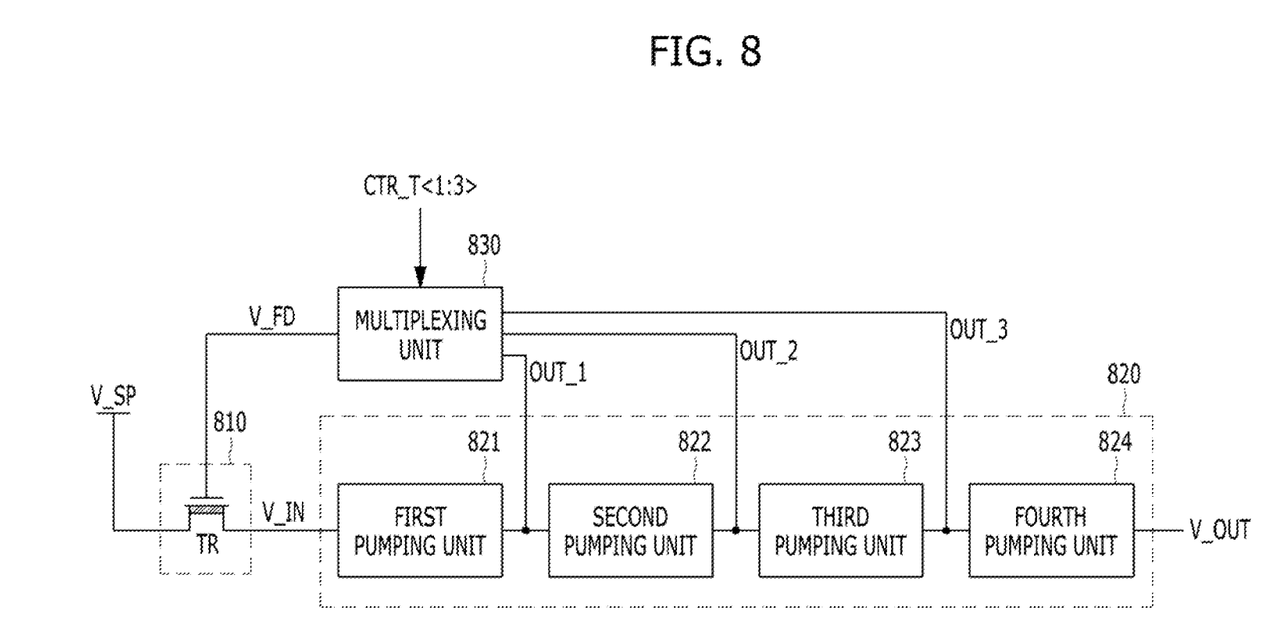
FIG. 8 is a block diagram illustrating a pumping voltage generation circuit in accordance with an embodiment of the present invention.

FIG. 8 is a block diagram illustrating a pumping voltage generation circuit in accordance with an embodiment of the present invention.

Referring to FIG. 8, the pumping voltage generation circuit may include a control unit 810, a pumping unit 820, and a multiplexing unit 830.

The control unit 810 stepwise controls a supply voltage V_SP in response to a feedback voltage V_FD output from the multiplexing unit 830 and outputs the controlled voltage as an input voltage V_IN. Furthermore, the pumping unit 820 serves to pump the input voltage V_IN input from the control unit 810 and may include first to fourth pumping units 821, 822, 823, and 824. It is assumed that the pumping unit 820 in accordance with the embodiment of FIG. 8 also includes the four pumping units, for convenience of description.

The multiplexing unit 830 outputs any one of first to third output voltages OUT_1, OUT_2, and OUT_3, that is, the output voltages of the first to third pumping units 821, 822, and 823, as the feedback voltage V_FD in response to control signals CTR_T<1:3>. The control signals CTR_T<1:3> are signals for controlling a voltage change rate of a final pumping voltage V_OUT. The time that is taken for the final pumping voltage V_OUT to reach a target voltage level may be controlled in response to the control signals CTR_T<1:3>.

A brief circuit operation is described below. In this case, the circuit operations of the control unit 810 and the pumping unit 820 have already been described with reference to FIG. 7, and thus the multiplexing unit 830 and the operation thereof are chiefly described below.

As described above, the multiplexing unit 830 outputs any one of the first to third output voltages OUT_1, OUT_2, and OUT_3 as the feedback voltage V_FD in response to the control signals CTR_T<1:3>. In this case, it is assumed that the multiplexing unit 830 outputs the first output voltage OUT_1 as the feedback voltage V_FD in response to the control signal CTR_T<1>, outputs the second output voltage OUT_2 as the feedback voltage V_FD in response to the control signal CTR_T<2>, and outputs the third output voltage OUT_3 as the feedback voltage V_FD in response to the control signal CTR_T<3>.

First, when the first output voltage OUT_1 is output as the feedback voltage V_FD is described below. In this case, the same operation as that of FIG. 7 is performed. That is, as already described above with reference to FIG. 7, the input voltage V_IN is stepwise increased from 2 V->4 V-> . . . , ->12 V, and the feedback voltage V_FD is also stepwise increased from 4 V->6V-> . . . , ->14 V. Furthermore, when the voltage level of the first output terminal OUT_1 becomes 14 V, the final pumping voltage V_OUT becomes 20 V, that is, a target voltage level.

An example where the third output voltage OUT_3 is output as the feedback voltage V_FD will now be described. The feedback voltage V_FD is also stepwise increased from 4 V->6V-> . . . , ->14 V. In this case, however, the rate at which the feedback voltage V_FD is increased is slower compared than when the first output voltage OUT_1 is fed back because the third output voltage OUT_3 is fed back. That is, the rate at which the feedback voltage V_FD rises is slower, and this means that the time taken for the final pumping voltage V_OUT to reach 20 V, that is, the target voltage level, is increased.

The pumping voltage generation circuit in accordance with an embodiment of the present invention may control the time that is taken for the final pumping voltage V_OUT to reach a target voltage level in response to the control signals CTR_T<1:3>.

The pumping voltage generation circuit may be included in a semiconductor device. The semiconductor device uses the final pumping voltage V_OUT generated from the pumping voltage generation circuit, in a required circuit. Furthermore, the supply voltage V_SP applied to the pumping voltage generation circuit may include an internal voltage generated within a semiconductor device or may be a voltage applied from an external source. Accordingly, the supply voltage V_SP may have an unwanted voltage level attributable to external or internal factors. An embodiment for overcoming these limitations is described below.

Figure 9:
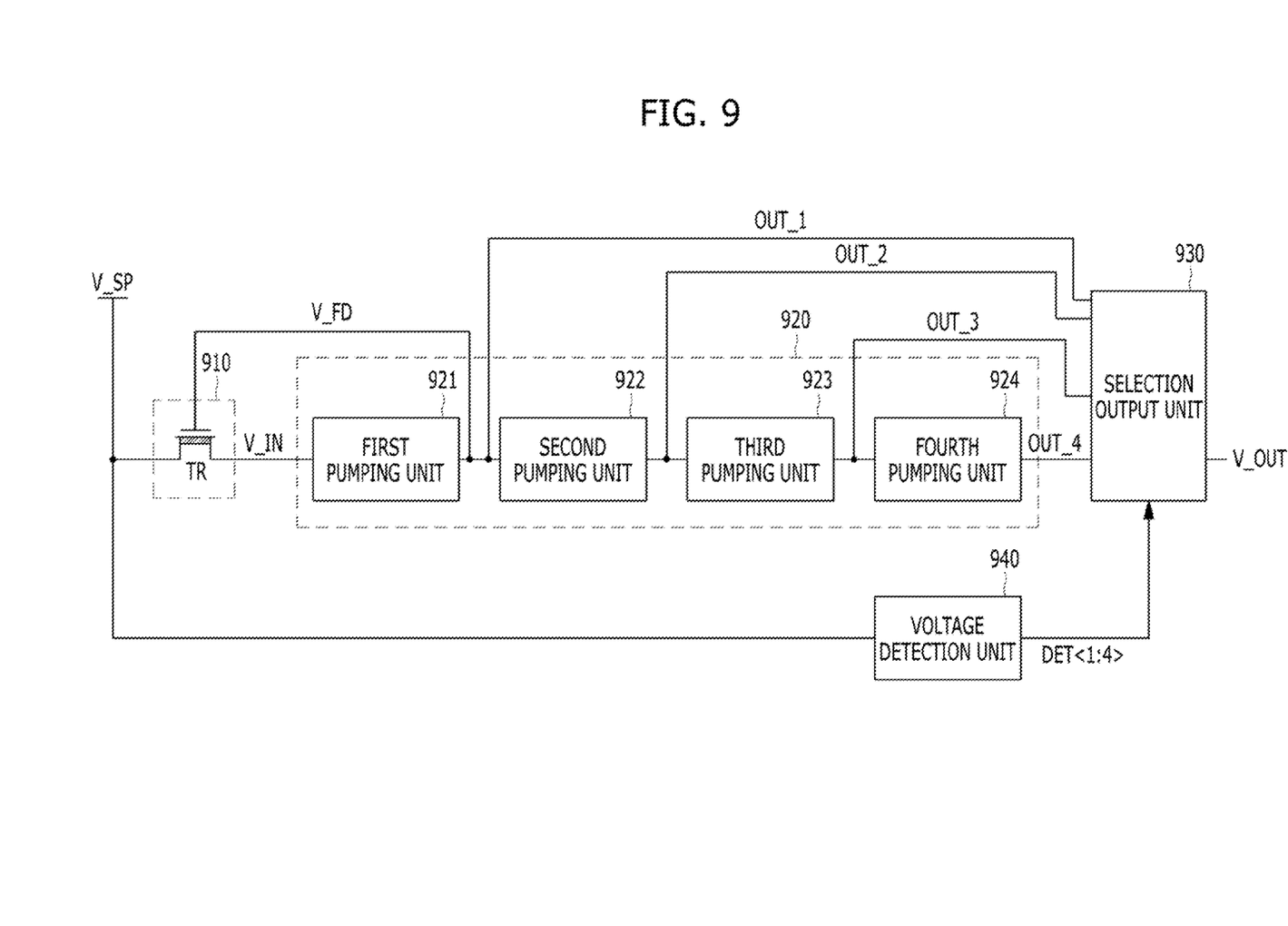
FIG. 9 is a block diagram illustrating a pumping voltage generation circuit in accordance with an embodiment of the present invention.

FIG. 9 is a block diagram illustrating a pumping voltage generation circuit in accordance with an embodiment of the present invention.

Referring to FIG. 9, the pumping voltage generation circuit may include a control unit 910, a pumping unit 920, a selection output unit 930, and a voltage detection unit 940.

The control unit 910 receives an output voltage of a first pumping unit 921 as a feedback voltage V_FD, stepwise controls a supply voltage V_SP, and outputs the controlled voltage as an input voltage V_IN. Although the control unit 910 in FIG. 9 receives the output voltage of the first pumping unit 921 as the feedback voltage V_FD, the embodiment is not limited thereto. The control unit 910 may receive any one of output voltages of a plurality of pumping units.

Furthermore, the pumping unit 920 serves to pump the input voltage V_IN input from the control unit 910 and may include first to fourth pumping units 921, 922, 923, and 924. It is assumed that the pumping unit 920 in accordance with the embodiment of FIG. 9 also includes four pumping units, for convenience.

The selection output unit 930 outputs any one of first to fourth output voltages OUT_1, OUT_2, OUT_3, and OUT_4, that is, the output voltages of the first to fourth pumping units 821, 822, 823, and 824, as a final pumping voltage V_OUT in response to detection signals DET<1:4>. For example, the selection output unit 930 may output the first output voltage OUT_1 as the final pumping voltage V_OUT in response to the detection signal DET<1>, may output the second output voltage OUT_2 as the final pumping voltage V_OUT in response to the detection signal DET<2>, may output the third output voltage OUT_3 as the final pumping voltage V_OUT in response to the detection signal DET<3>, and may output the fourth output voltage OUT_4 as the final pumping voltage V_OUT in response to the detection signal DET<4>. The voltage detection unit 940 detects a voltage level of the supply voltage V_SP and outputs the detection signals DET<1:4>.

An example in which the supply voltage V_SP is 12 V and the target voltage level of the final pumping voltage V_OUT is 20 V has been described so far. In the embodiment of FIG. 9, the supply voltage V_SP is assumed to be 16 V.

As described above, the feedback voltage V_FD, that is, the first output voltage OUT_1, stepwise rises from 2 V->4 V->6V . . . . Furthermore, since the supply voltage V_SP is 16 V, the input voltage V_IN rises up to 16 V, and the first output voltage OUT_1 is pumped up to 18 V. Furthermore, the second output voltage OUT_2 is pumped up to 20 V, the third output voltage OUT_3 is pumped up to 22 V, and the fourth output voltage OUT_4 is pumped up to 24 V. That is, a target voltage level of the final pumping voltage V_OUT becomes the second output voltage OUT_2. Accordingly, the voltage detection unit 940 detects that the supply voltage V_SP is 16 V and enables the detection signal DET<2>. The selection output unit 930 outputs the second output voltage OUT_2 of 20 V as the final pumping voltage V_OUT in response to the detection signal DET<2>.

The pumping voltage generation circuit in accordance with the embodiment of the present invention may generate a plurality of pumping voltages and select any one of the plurality of pumping voltages as the final pumping voltage V_OUT in response to the voltage level of the supply voltage V_SP.

As described above, the pumping voltage generation circuit in accordance with the embodiment of the present invention may overcome limitations attributable to a breakdown voltage by controlling a pumping operation based on breakdown voltage information. Furthermore, the area of a semiconductor device including the pumping voltage generation circuit may be minimized because the pumping voltage generation circuit is configured using a minimum number of pumping units.

Accordingly, there are advantages in that the area of an internal voltage generation circuit may be minimized and thus a semiconductor device including the internal voltage generation circuit may be minimized.

Furthermore, the location and type of logic gates and transistors illustrated in the aforementioned embodiments may be implemented differently depending on the polarity of input signals.

Although various embodiments have been described for illustrative purposes, it will be apparent to those skilled in the art that various changes and modifications may be made without departing from the spirit and scope of the invention as defined in the following claims.

What is claimed is:

1. An internal voltage generation circuit comprising:
   a pumping unit suitable for generating a pumping voltage by pumping an input voltage; and
   a control unit suitable for stepwise controlling a voltage level of the input voltage based on breakdown voltage information of the pumping unit,
   wherein an initial voltage level of the input voltage is set based on the breakdown voltage information and the input voltage increases stepwise by a voltage corresponding to the breakdown voltage information.

2. The internal voltage generation circuit of claim 1, wherein the control unit comprises:
   a voltage generation unit suitable for generating a plurality of reference voltages;
   a control signal generation unit suitable for generating a plurality of control signals based on the breakdown voltage information; and
   a selection output unit suitable for selectively outputting the plurality of reference voltages in response to the plurality of control signals.

3. The internal voltage generation circuit of claim 1, wherein the control unit includes a depletion type transistor coupled between a supply voltage terminal and an input terminal of the pumping unit and having a gate receiving the voltage corresponding to the breakdown voltage information of the pumping unit.

4. The internal voltage generation circuit of claim 3, wherein the pumping unit comprises a plurality of pumping units.

5. The internal voltage generation circuit of claim 4, further comprising:
   a multiplexing unit suitable for selecting an output voltage of one of the pumping units and feeding the selected output voltage back to the gate of the depletion type transistor.

6. The internal voltage generation circuit of claim 4, further comprising:
   a voltage detection unit suitable for detecting a voltage level of a supply voltage supplied to the control unit; and
   a selection output unit suitable for outputting an output voltage of one of the pumping units as the pumping voltage in response to an output signal of the voltage detection unit.

7. The internal voltage generation circuit of claim 6, wherein an output voltage of one of the pumping units is fed back to the gate of the depletion type transistor.

8. An internal voltage generation circuit comprising:
   a pumping unit suitable for generating a pumping voltage by pumping an input voltage;
   a detection unit suitable for detecting an output voltage of the pumping unit based on breakdown voltage information of the pumping unit; and
   a control unit suitable for stepwise controlling a voltage level of the input voltage based on the breakdown voltage information and an output signal of the detection unit,
   wherein an initial voltage level of the input voltage is set based on the breakdown voltage information and the input voltage increase stepwise by a voltage corresponding to the breakdown voltage information.

9. The internal voltage generation circuit of claim 8, wherein the detection unit controls when the input voltage is changed.

10. The internal voltage generation circuit of claim 8, wherein:
    the pumping unit comprises a plurality of pumping units, and
    the internal voltage generation circuit further comprises a multiplexing unit suitable for selecting an output voltage of the pumping units and feeding the selected output voltage back to the detection unit.

11. The internal voltage generation circuit of claim 8, wherein:
    the pumping unit comprises a plurality of pumping units, and
    the internal voltage generation circuit further comprises:
    a voltage detection unit suitable for detecting a voltage level of a supply voltage supplied to the control unit; and
    a selection output unit suitable for outputting an output voltage of one of the pumping units as the pumping voltage in response to an output signal of the voltage detection unit.

12. An internal voltage generation circuit comprising:
    a pumping unit suitable for generating a pumping voltage by pumping an input voltage; and
    a depletion type transistor coupled between a supply voltage terminal and an input terminal of the pumping unit and having a gate to which an output voltage of the pumping unit is fed back,
    wherein the depletion type transistor generates the input voltage by stepwise controlling a supply voltage supplied to the supply voltage terminal in response to the output voltage of the pumping unit.

13. The internal voltage generation circuit of claim 12, wherein a threshold voltage value of the depletion type transistor is set based on a breakdown voltage value of the pumping unit.

14. The internal voltage generation circuit of claim 13, wherein the threshold voltage value of the depletion type transistor is set to a value that is less than the breakdown voltage value of the pumping unit.

15. The internal voltage generation circuit of claim 12, wherein:
    the pumping unit comprises a plurality of pumping units, and
    the internal voltage generation circuit further comprises a multiplexing unit suitable for selecting an output voltage of one of the pumping units and feeding the selected output voltage to the gate of the depletion type transistor.

16. The internal voltage generation circuit of claim 12, wherein:
    the pumping unit comprises a plurality of pumping units, and
    the internal voltage generation circuit further comprises:
    a voltage detection unit suitable for detecting a voltage level of a supply voltage supplied to the supply voltage terminal; and
    a selection output unit suitable for outputting an output voltage of one of the pumping units as the pumping voltage in response to an output signal of the voltage detection unit.

17. The internal voltage generation circuit of claim 16, wherein an output voltage of one of the pumping units is fed back to the gate of the depletion type transistor.

\* \* \* \* \*